United States Patent [19]
Roskos

[11] Patent Number: 4,652,895
[45] Date of Patent: Mar. 24, 1987

[54] ZENER STRUCTURES WITH CONNECTIONS TO BURIED LAYER

[75] Inventor: Henry L. Roskos, Melbourne, Fla.

[73] Assignee: Harris Corporation, Melbourne, Fla.

[21] Appl. No.: 782,192

[22] Filed: Sep. 30, 1985

Related U.S. Application Data

[63] Continuation of Ser. No. 406,345, Aug. 9, 1982.

[51] Int. Cl.[4] .............................................. H01L 29/90
[52] U.S. Cl. ........................................ 357/13; 357/58; 357/48; 357/20; 357/64
[58] Field of Search .................... 357/13, 64, 20, 49, 357/63, 13 O, 13 R, 13 LM, 48, 58

[56] References Cited

U.S. PATENT DOCUMENTS

| | | | |
|---|---|---|---|
| 3,335,341 | 8/1967 | Lin | 357/13 |
| 3,735,210 | 5/1973 | Kalish et al. | 357/13 X |
| 3,758,831 | 9/1973 | Clark | 357/13 X |
| 3,909,119 | 9/1975 | Wolley | 357/13 |
| 4,136,349 | 1/1979 | Tsang | 357/13 |
| 4,177,095 | 12/1979 | Nelson . | |
| 4,291,319 | 9/1981 | Carinacci | 357/13 |

FOREIGN PATENT DOCUMENTS

| | | | |
|---|---|---|---|
| 0017022 | 10/1980 | European Pat. Off. | 357/13 |
| 0010287 | 1/1978 | Japan | 357/13 |
| 0006480 | 1/1979 | Japan | 357/13 LM |
| 55-41770 | 3/1980 | Japan | 357/13 |
| 0056972 | 4/1982 | Japan | 357/13 |
| 55160805 | 5/1982 | Japan | 357/13 |
| 0085266 | 5/1982 | Japan | 357/13 |

*Primary Examiner*—Martin H. Edlow
*Assistant Examiner*—William A. Mintel
*Attorney, Agent, or Firm*—Barnes & Thornburg

[57] ABSTRACT

A buried zener diode of reduced noise, bulk resistance and dynamic resistance, formed in an N− layer having a H+ layer buried, including a P+ surface anode of greater lateral area than an N+ cathode which is connected to a surface contact through the buried N+ layer and an N+ channel extending from the surface to the buried N+ layer. It also may be formed with a buried anode by reversing the conductivity types.

15 Claims, 5 Drawing Figures

ZENER STRUCTURES WITH CONNECTIONS TO BURIED LAYER

This is a continuation of application Ser. No. 406,345, filed Aug. 9, 1982.

BACKGROUND OF THE INVENTION

1. Field of the Invention

This invention relates generally to a semiconductor device and, more particularly, pertains to N+ buried zener structures.

It is well-known in the prior art to use monolithic subsurface or buried zener structures. A typical prior art device has a deep P+ diffusion forming the anode and a shallow N+ diffusion overlapping the deep P+ diffusion to form the cathode. As illustrated, in FIG. 1, a typical prior art buried zener structure includes a P substrate 130, an N− epitaxial layer 10, and N+ buried layer 30 on the boundary between the P− substrate and the N− layer, a P− layer 50 extending from the surface and down into the N− layer, a shallow P+ region 110 within the P− layer 50 and on the surface thereof, a shallow N+ region 70 extending from the surface down and into the P− layer, and finally a deep P+ diffusion region 90 extending from the edge of the N+ region 70 through the P− layer 50 and through the N− layer 10 to the N+ buried layer 30. The negative terminal 170 is attached to the P+ anode region 110 and the positive terminal 190 is connected to the N+ surface cathode region 70. The PN junction of interest (i.e., the subsurface zener metalurgical junction) is formed at 150 beneath the surface and is the intersection of region 70 and region 90. Note that the N+ buried layer 30 is formed as a byproduct in some IC manufacturing techniques and is not required for the efficient operation of this subsurface zener structure.

In some applications, primarily junction isolation (JI) monolithic IC's, the processing step(s) used to create the deep P+ diffusion region 90 may also be used to form the junction isolation diffusion. Consequently, the deep P+ region 90 diffusion of the zener forms a PN junction with the buried N+ layer 30. This is undesirable because the junction formed by the N+ buried layer 30 and the deep P+ diffusion 90 is an unnecessary electrically inactive parasitic junction. In addition, prior art zener structures have other inherent disadvantages because they use a deep P+ channel that is usually of boron which does not diffuse as uniformly as phosphorous and, thus, the junction formed with the shallow N+ region 70 and the deep P+ region 90 is not completely uniform, and therefore the incidence of burst noise is higher. Another disadvantage is that there is a large dynamic resistance and a large parasitic bulk resistance in the voltage sense path between P+ regions 90 and 110 through the P− region 50. This can lead to an undesirable nonlinear relationship between the zener voltage and absolute temperature. Another disadvantage is that the current forced into terminal connection 190 must be withdrawn from terminal connection 170. This leads to a forcing current return path at or near the Si-SiO$_2$ interface. This, in turn, leads to increased 1/f noise.

The so-called Kelvin subsurface zener structures address the problem of a large parasitic bulk resistance in the voltage sense path by providing two electrical paths, one for the forcing current, and one for the voltage sense (the voltage sense path, theoretically, draws no current). However, Kelvin subsurface zener structures do not address the problem of a large dynamic resistance and the parasitic N+ buried layer/deep P+ diffusion junction. In addition, Kelvin subsurface zener structures are, in some applications, unsatisfactory because they can require a considerable amount of extra area to fabricate them. Further, 1/f noise is proportional to junction area and, therefore, larger structures lead to increased 1/f noise. Lastly, Kelvin subsurface zeners can, at best, approach the noise performance of prior art zeners because of the less uniform diffusion of boron and the fact that the forcing current return path is near the Si-SiO$_2$ interface.

Thus, there exists a need for an improved subsurface zener structure to be used in monolithic IC's (of which JI monolithic IC's are a subset) that has improved resistance and noise characteristics and can be fabricated as easily as any prior art JI monolithic IC structure.

SUMMARY OF THE INVENTION

An object of the present invention is to provide a monolithic subsurface zener structure having improved resistance characteristics.

Another object of the present invention is to provide a monolithic subsurface zener structure having reduced dynamic resistance.

A still further object of the present invention is to provide a monolithic subsurface zener structure that does not contain a parasitic buried N−/deep P+ diffusion junction.

An even further object of the present invention is to provide a monolithic subsurface zener structure which can be made without requiring any additional area for its fabrication.

An additional object of the present invention is to provide a monolithic subsurface zener structure having lower 1/f noise and having reduced incidence (and magnitude) of burst noise.

These and other objects of the invention are attained by forming a buried zener diode using deep N+ channels, instead of deep P+ channels, that are intentionally diffused into an N+ buried layer, thereby creating a low resistance return path through the N+ buried layer which is well away from the Si-SiO$_2$ interface. A first deep N+ channel in the form of a ring extends from the surface of an N− epitaxial layer into the N+ buried layer. Within this deep N+ ring there is formed a shallow P+ region on the surface of the epitaxial layer and a second deep N+ channel which extends from the P+ shallow region into the N+ buried layer. The lateral area of the P+ shallow region being greater than the second deep N+ channel such that a subsurface zener diode is formed at their interface. A positive electrical contact is made with the deep N+ channel ring which surrounds this zener diode structure and a negative electrical contact is made with the shallow P+ region. Thus, the shallow P+ region forms the anode and the second deep N+ channel forms the cathode. Thus, the current flows from the deep N+ ring to the N+ buried layer and then to the second deep N+ channel and up through the P+ shallow region. this path is one of low resistance since it consists solely of heavily doped N+ and P+ regions, and provides a current return path that is well away from the Si-SiO$_2$ interface.

Alternatively, the conductivities of the deep channels and the shallow region can be reversed thus producing a zener diode structure in which the buried layer is of P+ conductivity, and the deep channel that forms a ring and extends from the surface into the P+ buried layer is also of P+ conductivity. In addition in this modification, the shallow region which forms one part of the zener diode is an N+ conductivity cathode and the deep channel which extends from the N+ shallow region to the P+ buried layer is a P+ conductivity type anode. Also, in this embodiment, a P− region may or may not be formed, depending on the eventual circuit application, which extends from the surface of the N− epitaxial layer to a greater depth than the N+ shallow region and extends around and between the two deep P+ channels. In a third embodiment, an annular PNP transistor can be wrapped around a central subsurface zener diode which employs the deep N+ channels, shallow P+ region, and N+ buried layer of embodiment 1 described above. In a fourth embodiment, an annular PNP can be wrapped around a central subsurface zener diode employing the deep P+ channels, shallow N− region, P+ buried layer, and P− region of embodiment two described above.

The process of fabrication for the first embodiment begins when N type impurities are diffused into N− epitaxial layer having an N+ buried layer therein, using appropriate masking to form a first deep N+ channel in the form of a ring and a second deep N+ channel inside the ring, so that both channels extend from the surface of the epitaxial layer to the N+ buried layer. Additional N conductivity type impurities are diffused into the first channel to assist in the formation of an ohmic contact region with the metalization (connection terminals). P conductivity type impurities are then diffused into and around the second deep N+ channel to form a shallow P+ conductivity anode region so as to have a common boundary with the second deep N+ conductivity type channel below the surface of the epitaxial layer to produce a buried zener junction. In one embodiment, the N conductivity type impurities may be ion implanted into the epitaxial layer before diffusing them to form the first and/or second deep N+ conductivity type channels. In another embodiment, the N conductivity type impurities may be deposited onto the epitaxial layer using conventional open tube deposition techniques. The N+ conductivity impurities are then diffused in the same manner as in the above ion implanted embodiment to form the first and/or second deep N+ channels. In still another embodiment, the conductivities may be reversed; the fabrication steps are identical, except that a shallow P− region may or may not be formed to surround the deep P+ channels.

A final advantage is obtained by using the deep N+ processing to simultaneously form low resistance collector contacts for NPN transistors. For monolithic IC's, this feature could result in considerable area savings and enhanced performance due to a lowering of the parasitic collector series resistance. In prior art deep P+ buried zeners, additional processing is required to obtain a similar reduction in NPN collector series resistance.

Other objects, advantages and novel features of the present invention will become apparent from the following detailed description of the invention when considered in conjunction with the accompanying drawings.

DESCRIPTION OF THE PREFERRED EMBODIMENTS

Figure 1:
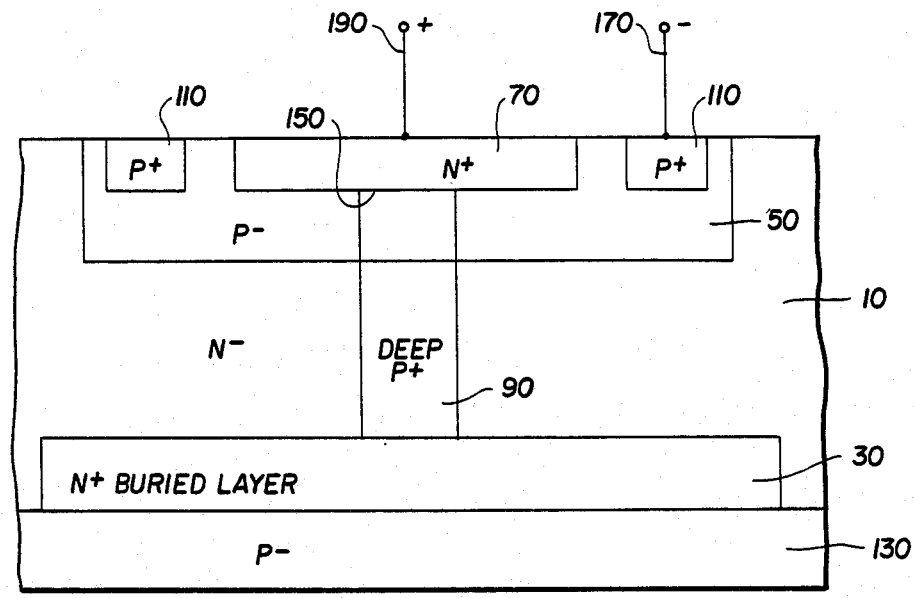
FIG. 1 is a cross-sectional view of a prior art nonKelvin zener diode.
Figure 2:
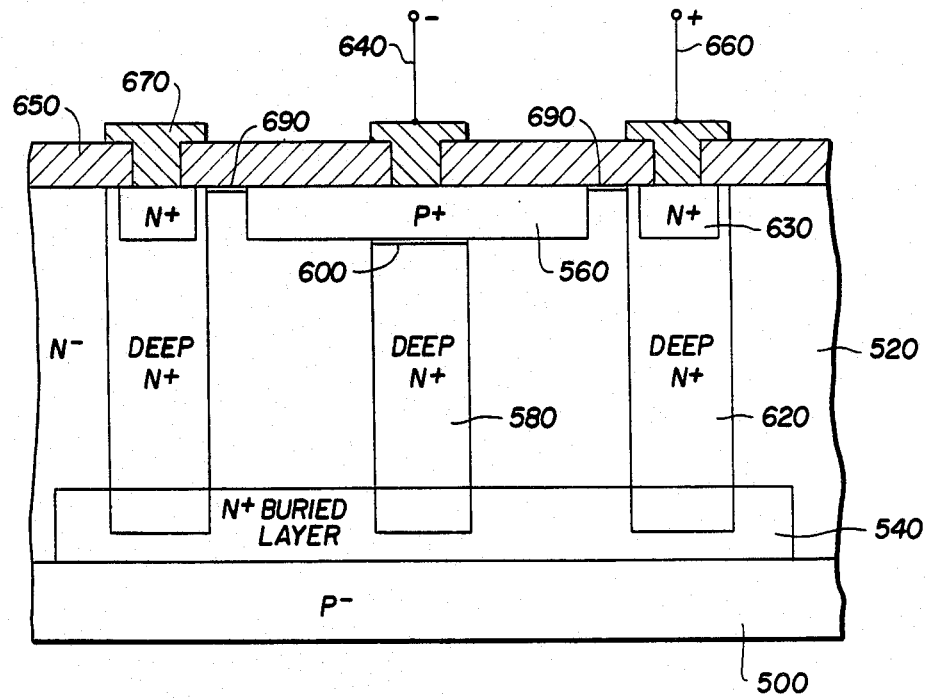
FIG. 2 is a cross-sectional view of a zener diode formed in a substrate containing an N+ buried layer incorporating the principles of the present invention.

A zener diode incorporating the principles of the present invention is illustrated in FIG. 2. The N+ buried layer 540 is buried between a P− substrate 500 and an N− epitaxial layer 520 which is grown on the P− substrate. A first deep N+ channel in the shape of a ring 620 extends from the surface of the N− epitaxial layer down to the N+ buried layer 540. In addition, deep N+ channel 620 contains an N+ contact portion 630 at the surface of the epitaxial layer which is of higher conductivity than the rest of deep N+ channel 620.

At the center of the deep N+ channel ring 620 is formed a zener diode. The zener diode includes a shallow P+ anode region 560 formed at the surface of the N− epitaxial layer 520 and a second deep N+ channel 580 which extends from the shallow P+ anode region 560 to the N+ buried layer 540. The depth of the P+ region 560 is not critical. As an example and not by way of limitations in this embodiment, it is approximately 1.47 microns. To guarantee subsurface breakdown, the lateral area of P+ region 560 must be greater than the lateral area of deep N+ region 580. By way of example, the drawn distance from region 560 to the first deep N+ channel 620 is about 30 microns.

The second deep N+ channel 580 acts as the cathode. The junction 600 which is formed between the shallow P+ region 560 and the second deep N+ channel 580 is the buried zener PN junction of the invention. Thus, the breakdown at the PN junction 600 occurs below the surface.

The current flows from the deep N+ ring 620 through the N+ buried layer 540, then to the second deep N+ channel 580 and to the shallow P+ region 560. This path is one of low resistance since it consists solely of heavily doped regions. Thus, the dynamic and the bulk resistances are decreased substantially over the prior art. In addition, the already low 1/f noise is further reduced because the low resistance return path produces considerably less noise as well as providing a return path well away from the surface, thereby avoiding any degrading interaction with the surface interface states.

Note that phosphorous may be used as the impurity for the N regions, and boron may be used for the impurity for the P regions. Because phosphorous diffuses more evenly than boron, the junction the deep N+ channel 580 makes with the shallow P+ region 560 is more uniform than prior art subsurface zeners using deep P+ channels doped with boron. Consequently, the occurrence of microplasma breakdown and burst is reduced.

Figure 3:
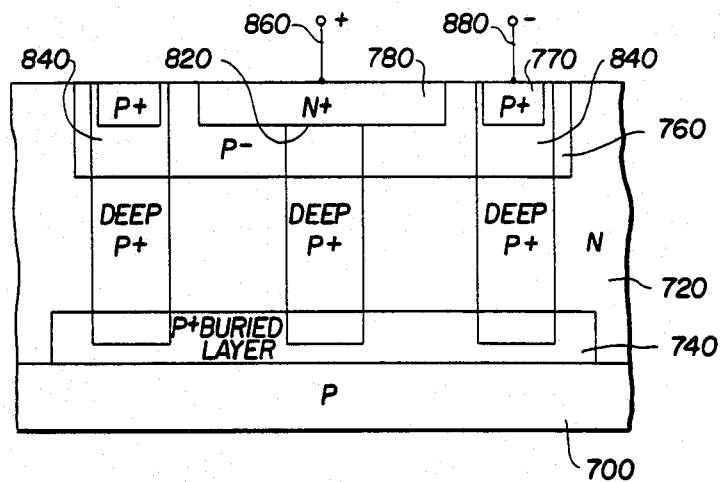
FIG. 3 is a cross-sectional view of another embodiment of the zener diode formed in the substrate having a P+ buried layer incorporating the principles of the present invention.

As illustrated in FIG. 3 which shows another embodiment of the invention, a buried zener diode is shown having opposite conductivity from the type in FIG. 2. FIG. 3 shows a P− substrate 700 having buried therein a P+ buried layer 740 and an N− epitaxial layer 720 on the substrate 700. First deep P+ channel or ring 840 extends from the surface of the epitaxial layer 720 to the P+ buried layer 740.

Inside the first P+ channel or ring 840 is disposed the zener diode. The diode includes an N+ shallow region 780 at the surface of the N− epitaxial layer 720 and a second deep P+ channel 800 extending from the bottom of the N+ shallow region 780 to the P+ buried layer 740. A positive terminal 860 is connected to the shallow N+ region 780, which forms the cathode. A negative terminal 880 is connected to a high conductivity portion 770 of the first deep P+ channel 840. The second deep P+ channel 800 forms the anode of the zener diode. PN junction 820 at the intersection of the second deep P+ channel 800 and the shallow N+ region 780 is the PN junction of the buried zener diode. In addition, an optional shallow P− region 760 extends from the surface of the N− epitaxial layer to a depth greater than the shallow N+ region 780 and extends from outside the first deep P+ channel, which forms a ring 840, to the space between the first deep P+ channel 840 and the second deep P+ channel 800, to isolate the shallow N+ region 780 from the epitaxial layer 720. This region 760 may or may not be included, depending on the circuit application.

Again, in this embodiment, the dynamic and the bulk resistances are decreased substantially by the use of a low resistance DC current return path through the P+ buried layer. Specifically, the current flows from the N+ shallow region 780 to the deep P+ channel 800 through the P+ buried layer 740 to the deep P+ ring 840. This path is one of low resistance since it consists solely of heavily doped P+ and N+ regions. The $1/f$ noise is reduced because the low resistance return path produces less shot noise than prior art subsurface zeners as well as provides a return path well away from the surface, thereby eliminating any degrading interaction with surface interface states.

Note that in all embodiments, it is important that the deep channels make good electrical contact with the buried layer, because it is these deep channels that provide the low resistance return path through the buried layer, thereby avoiding interaction with the Si-SiO$_2$ interface, and forms the basis for this invention.

Figure 4:
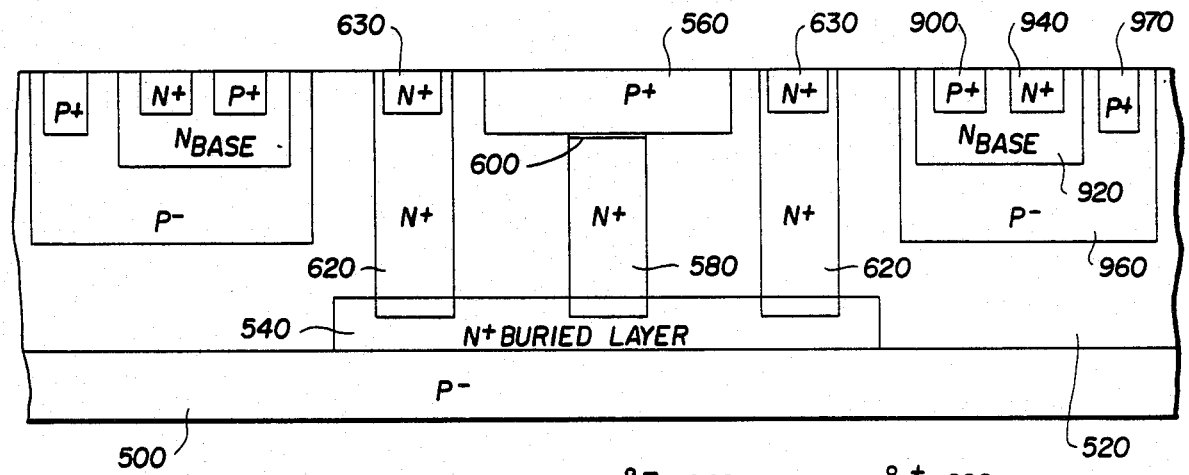
FIG. 4 is a cross-sectional view of still another embodiment wherein an annular PNP transistor is wrapped around a central deep N+ subsurface zener diode incorporating the principles of the present invention.

FIG. 4 shows the structure of FIG. 2, with an annular PNP transistor, wrapped around the subsurface zener structure. The numbering is the same for all the regions that are identical in FIGS. 2 and 4. The P+ emitter 900 is formed in N base 920 which includes N base contact 940. The base 920 is formed in P− collector channel 960 which forms a ring and surrounds the deep N+ ring 620. The P+ region 970 forms the collector contact.

A process for fabricating the zener diode of the present invention as shown in FIG. 2 begins with the formation of the deep N+ channels 580 and 620 in the N− epitaxial layer 520 which is on a P− substrate 500 and has an N+ buried layer 540 therebetween. N type impurities, for example, phosphorous, are preferably ion implanted in the N− epitaxial layer through a mask and then are diffused by a diffusion cycle to form a deep N+ channel 620 which is in the form of a ring, and deep N+ channel 580 which is in the interior of the ring 620. By way of example, the average impurity concentration of the deep N+ channels may be approximately $2 \times 10^{19}$ atoms/cm$^3$. Additional N type impurities are then diffused into the deep N+ channel 620 to form a contact region 630 at the surface of the deep N+ channel 620 of higher conductivity than the rest of the N+ channel. By way of example this impurity concentration is approximately $5 \times 10^{20} - 10^{21}$ atoms/cm$^3$.

Next, P type impurities, for example, boron, are introduced at the surface of the N− epitaxial layer on top of the deep N+ channel 580 to form region 560. This step is also done by the appropriate masking. By way of example, the concentration of the P+ region is approximately $10^{20}$ atoms/cm$^3$. Alternatively, these last two steps of forming the P+ shallow region and a high N+ contact region may be reversed. The process is then completed in the usual manner to form surface passivation/insulation 650 and a typical contact aperture with metalization 670. The Si-SiO$_2$ interface region of interest is indicated by 690.

Note that although it is preferred that one use an ion implanatation of the N+ impurities before the diffusion cycle, it is possible to make this invention without the ion implantation and using deposition and diffusion of the impurities, although a considerable improvement in process control can be achieved over prior art zeners if one uses a phosphorous ion implantation followed by a diffusion cycle. This is possible because of the added control provided by the ion plantatation process. Note also that no additional steps need be performed in the manufacture of DI monolithic IC's, in order to produce the subsurface zener diode of the present invention; all that is required is that the prior art boron deposition process step be replaced with the present invention step of either phosphorous ion implant or phosphorous deposition. Therefore, there are no extra processing steps.

For the case of JI monolithic IC's, one additional masking step and one additional deposition or ion implantation step is required to fabricate the present invention.

A process for fabricating the zener diode of FIG. 3 begins with the formation of deep P+ channels 800 and 840 in a P− substrate having a P+ buried layer 740. P type impurities are ion implanted using the appropriate masking and are then diffused by a diffusion cycle to form the deep P+ channel 840 which is in the shape of a ring with a deep P+ channel 800 in the interior of the ring, both of which extend from the surface of the N− epitaxial layer to the P+ buried layer 740. Next, P type impurities are diffused into the surface of the epitaxial layer 720 to form a shallow P− conductivity region in the form of a ring 760 which surrounds the deep P+ channel 840 and extends between the deep P+ channel 840 and the deep P+ channel 800. Next, the N type impurities are diffused into and around the deep P+ channel 800 to a depth less than the depth of the P− shallow region 760 to form shallow N+ region 780, thus forming a PN subsurface junction 820 between the deep P+ channel 800 and the shallow N+ region 780. Next, P type impurities are diffused into the deep P+ channel 840 to form a region 770 having a depth less than the shallow P− region 760 and of a higher conductivity than the rest of the deep P+ channel 840. Alternatively, these last two steps of forming the region 780 and 770 may be reversed. The process is then completed in the usual manner. None of this is shown for the sake of clarity. Depending on the circuit application, region 760 may be omitted.

In fabricating a zener diode surrounded PNP transistor as seen in FIG. 4, the steps of fabricating a zener diode of FIG. 2 are followed, with the following additions. Channel 960, in the shape of a ring and surrounding channel 620, has its P type impurities introduced into a N— epitaxial layer just after ion implantation of N type impurities for channel 620 and channel 580, but before the diffusion step. This affords the opportunity to simultaneously diffuse the deep N+ channels 620 and 580, with the P— channel 960. Next, the N base channel 920 is created. Simultaneously, with the diffusing of the P+ type shallow region 560, the annular P+ collector contact channel 970 and the emitter contact 900 of the PNP transistor are formed by appropriate masking. Lastly, simultaneous with the creation of channel 630, the N base contact region 940 is fabricated.

Figure 5:
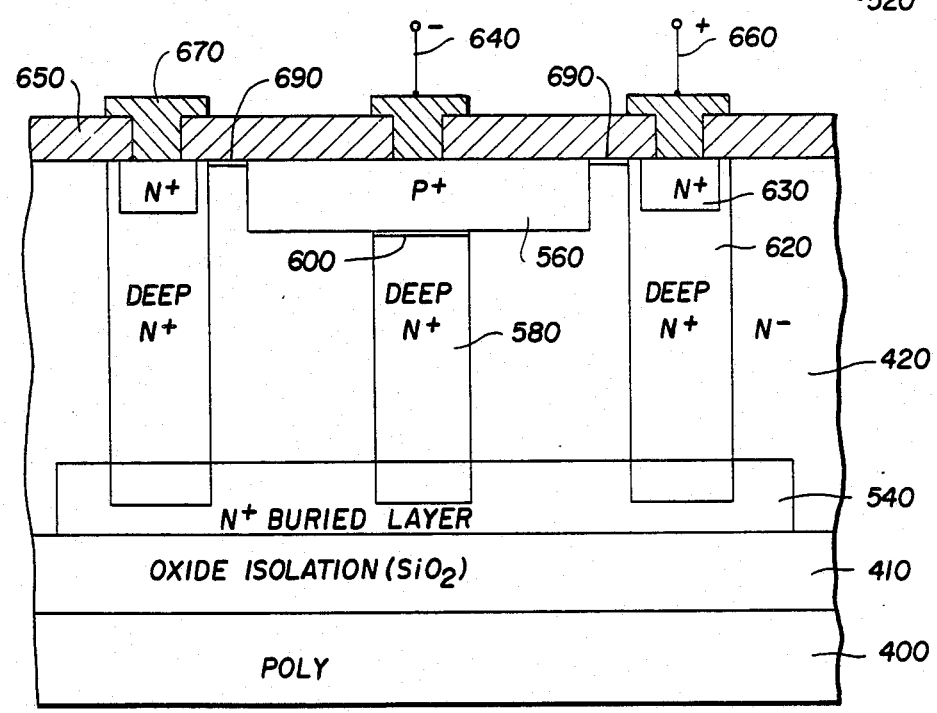
FIG. 5 is a cross-sectional view of the zener diode formed in DI (dielectric isolation) material containing an N+ buried layer incorporating the principles of the present invention.

While the structures of FIGS. 2–4 have been described as being formed in a P— substrate with an N— epitaxial layer, the subsurface zener described hereinabove may be formed in an N— substrate having P— epitaxial layer. If conductivities of the other regions would be then reversed, there would be no need for the optional shallow P— region 760 in FIG. 3 and there would be a need for an optional shallow N— region in FIG. 2 in the same position as shallow P— region in FIG. 3. Further, the structures of FIGS. 2–4 and described hereinabove may be formed in DI substrate material. By way of example, in the embodiment in FIG. 2, substrate 500 is replaced by oxide isolation layer 410 and poly layer 400, as illustrated in Figure 5. By virtue of the material processing required to manufacture DI IC's, the N— epitaxial layer 520 in FIG. 2 is replaced by an N— substrate material 420 in FIG. 5. All other processing for the DI material case is identical to that described hereinabove to fabricate the present invention in JI material. All embodiments, enhancements, and embellishments described herein may be fabricated in DI monolithic IC's. FIG. 5, by way of example, indicates the DI embodiment of the present invention previously described for the case of JI monolithic IC's and appearing in FIG. 2. Where the regions in FIGS. 2 and 5 are identical, there numeration is also identical.

Although the symbols P, P+, P— and N, N+ and N— are used, they are just illustrations of relative impurity concentrations.

From the preceding description of the preferred embodiments, it is evident that the objects of the invention are attained and although the invention has been described and illustrated in detail, it is to be clearly understood that the same is by way of illustration and example only and is not to be taken by way of limitation. The spirit and scope of this invention are to be limited only by the terms of the appended claims.

What is claimed is:

1. A buried zener diode formed in an N conductivity type layer of a low impurity concentration having a surface portion, and an N conductivity type buried layer of a higher impurity concentration than said low impurity concentration at the bottom of said low impurity N layer, the improvement comprising:
   a first deep N conductivity type channel of said higher impurity concentration extending from said surface of said low impurity N layer to said buried layer;
   a shallow P conductivity type anode region in said surface;
   a second deep N conductivity type cathode channel of
   said higher impurity concentration extending from the bottom of said shallow P conductivity type anode region into said buried layer to produce a buried breakdown zener junction;
   said shallow P conductivity type anode region being of greater lateral area than said second deep N conductivity type cathode channel;
   an anode contact at said shallow P conductivity type anode region; and
   a cathode contact at said first deep N conductivity type channel.

2. A buried zener diode according to claim 1, wherein said N type impurities are phosphorous and said P type impurities are boron.

3. A buried zener diode according to claim 1, wherein said first deep N conductivity type channel is in the form of a ring surrounding and spaced from said second deep N conductivity type channel.

4. A buried zener diode according to claim 1, wherein said first deep N conductivity type channel contains a greater impurity concentration region at the surface of said low impurity N layer than the rest of said first deep N conductivity type channel and said cathode contact is made to said greater impurity concentration region.

5. A buried zener diode according to claim 3, further including an annular PNP transistor wrapped around said zener diode so that the diameter of the collector, base and emitter rings are greater than the diameter of said first deep conductivity type ring.

6. A buried zener diode according to claim 1 wherein said low impurity N layer is an epitaxial layer on a P conductivity type substrate.

7. A buried zener diode according to claim 1, wherein said buried layer is substantially spaced from said shallow P conductivity type anode region.

8. A buried zener diode according to claim 1, including a substrate, and a layer of dielectric isolation separating said low impurity N layer and said buried layer from said substrate.

9. A buried zener diode according to claim 1, wherein the depth of said second deep cathode channel is substantially greater than the depth of said shallow anode region.

10. A buried zener diode formed in an N conductivity type layer of a low impurity concentration having a surface portion and a P conductivity type buried layer of a higher impurity concentration than said low impurity concentration at the bottom of said N layer, the improvement comprising:
   a first deep P conductivity type channel of said higher impurity concentration extending from said surface of said N layer to said buried P layer;
   a shallow N conductivity type cathode region of
   a higher impurity concentration than said low impurity concentration and spaced substantially from said buried layer in said surface;
   a second deep P conductivity type anode channel of said higher impurity concentration extending from the bottom of said shallow N conductivity type cathode into said buried layer to produce a buried breakdown zener junction;
   said shallow N conductivity type region being of greater lateral area than said second deep P conductivity type channel;
   an anode contact at said first deep P conductivity type channel; and a cathode contact at said shallow N type cathode region.

11. A buried zener diode according to claim 10, wherein said first deep P conductivity channel is in the form of a ring surrounding and spaced from said second deep conductivity type channel.

12. A buried zener diode according to claim 10, wherein said N layer is an epitaxial layer on a P conductivity type substrate.

13. A buried zener diode formed in an N conductivity type layer of a low impurity concentration having a surface portion, and a P conductivity type buried layer of a higher impurity concentration than said low impurity concentration at the bottom of said N layer, the improvement comprising:
   a first deep P conductivity type channel of said higher impurity concentration extending from said surface of said N layer to said buried P layer;
   a shallow N conductivity type cathode region of a higher impurity concentration than said low impurity concentration and spaced substantially from said buried layer in said surface;
   a second deep P conductivity type anode channel of said higher impurity concentration extending from the bottom of said shallow N conductivity type cathode into said buried layer to produce a buried breakdown zener junction;
   a P conductivity region of a lower impurity concentration than said higher impurity concentration extending into said N layer a greater distance than said shallow N conductivity type anode region, but not as deep as said buried layer, and extending laterally between said first and second deep P conductivity type channels;
   said shallow N conductivity type region being of greater lateral area than said second deep P conductivity type channel;
   an anode contact at said first deep P conductivity type channel; and
   a cathode contact at said shallow N type cathode region.

14. A buried zener diode according to claim 10, including a substrate, and a layer of dielectric isolation separating said low impurity N layer and said buried layer from said substrate.

15. A buried zener diode according to claim 10, wherein the depth of said second deep anode channel is substantially greater than the depth of said shallow cathode region.

* * * * *